United States Patent
Kim et al.

(10) Patent No.: US 11,347,436 B2
(45) Date of Patent: May 31, 2022

(54) STORAGE DEVICE ACCESSIBLE ON A CELL-BY-CELL BASIS AND METHOD OF OPERATING THE SAME

(71) Applicant: SAMSUNG ELECTRONICS CO., LTD., Suwon-si (KR)

(72) Inventors: Doo Hyun Kim, Hwaseong-si (KR); Jong-Hoon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/988,909

(22) Filed: Aug. 10, 2020

(65) Prior Publication Data

US 2021/0200471 A1 Jul. 1, 2021

(30) Foreign Application Priority Data

Dec. 26, 2019 (KR) .................. 10-2019-0174861

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .......... G06F 15/76; G06F 13/36; G06F 15/78; G06F 12/08; G06F 13/40; G06F 9/302; G06F 15/00; G06F 3/00; G06F 7/50; G06F 7/523; G06F 7/57; G06F 3/0659; G06F 3/0679; G06F 11/076; G06F 11/221; G06F 3/0604; G06F 7/5443; G06F 2207/4824; G06F 12/0246; G06F 3/1446; G06F 11/3034; G06F 11/3037; G06F 11/3495; G06F 2201/81; G06F 3/0614; G06F 3/0631; G06F 3/064; G06F 3/0658; G06F 11/1016; G06F 11/102; G06F 11/16; G06F 11/1616; G06F 11/1658; G06F 11/34; G06F 11/3433; G06F 12/0253; G06F 12/06;
(Continued)

(56) References Cited

U.S. PATENT DOCUMENTS 9,594,524 B2 3/2017 Lam
10,032,512 B2 7/2018 Senoo et al.
(Continued)

FOREIGN PATENT DOCUMENTS

KR 10-2018-0135316 12/2018
KR 10-2019-0103610 9/2019

*Primary Examiner* — Thong Q Le
(74) *Attorney, Agent, or Firm* — F. Chau & Associates, LLC

(57) ABSTRACT

A storage device includes a nonvolatile memory device having a plurality of memory cells and a storage controller. Each memory cell is set to one of a plurality of memory cell states, wherein distinct subsets of the memory cell states are associated with one of a plurality of data sets. The storage controller accesses data stored in one of the memory cells in a first state, performs a multiplier-accumulator (MAC) operation on the data, and sets the one memory cell to a second state corresponding to a result of the MAC operation to perform an in-place update.

20 Claims, 15 Drawing Sheets

(51) Int. Cl.
  *G11C 16/34* (2006.01)
  *G11C 16/14* (2006.01)
  *G11C 16/10* (2006.01)
  *G06F 7/544* (2006.01)
  *G06N 3/04* (2006.01)
  *G11C 16/26* (2006.01)
  *G11C 16/04* (2006.01)

(52) U.S. Cl.
  CPC ............. *G06F 7/5443* (2013.01); *G06N 3/04* (2013.01); *G11C 16/10* (2013.01); *G11C 16/14* (2013.01); *G11C 16/26* (2013.01); *G11C 16/349* (2013.01); *G11C 16/0483* (2013.01)

(58) Field of Classification Search
  CPC ............. G06F 12/0646; G06F 12/0882; G06F 13/1657; G06F 15/8038; G06F 2015/765; G06F 2212/7203; G06F 3/061; G06F 3/0616; G06F 3/0629; G06F 8/41; G06F 8/427; G06F 8/45; G06F 9/30; G06F 9/3001; G06F 9/30036; G06F 9/3885; G06F 9/3889; G06F 9/3895; H01L 27/11526; H01L 27/1157; H01L 27/11582; G11C 16/26; G11C 11/5642; G11C 16/0483; G11C 2029/0409; G11C 16/349; G11C 16/08; G11C 16/10; G11C 16/14; G11C 16/3404; G11C 16/3422; G11C 2211/5634; G11C 2211/5648; G11C 29/021; G11C 29/028; G11C 11/54; G11C 11/5628; G11C 11/5635; G11C 2207/2254; G11C 7/1006; G11C 2029/0411; G11C 29/52; G11C 16/345; G11C 7/18; G11C 8/08; G11C 11/1655; G11C 11/1657; G11C 11/1675; G11C 11/404; G11C 11/4076; G11C 11/408; G11C 11/409; G11C 11/4093; G11C 11/5621; G11C 11/5671; G11C 16/3495; G11C 7/1072

See application file for complete search history.

(56) References Cited

U.S. PATENT DOCUMENTS

| | | |
|---|---|---|
| 10,332,594 B2 | 6/2019 | Miyashita et al. |
| 2018/0034479 A1 | 2/2018 | Galbraith et al. |
| 2019/0164617 A1 | 5/2019 | Tran et al. |
| 2019/0189221 A1* | 6/2019 | Kim .................. G11C 16/26 |
| 2019/0311255 A1 | 10/2019 | Wang |

* cited by examiner

STORAGE DEVICE ACCESSIBLE ON A CELL-BY-CELL BASIS AND METHOD OF OPERATING THE SAME

This U.S. non-provisional patent application claims the benefit of priority under 35 U.S.C. § 119 to Korean Patent Application No. 10-2019-0174861, filed on Dec. 26, 2019, in the Korean Intellectual Property Office, the disclosure of which is incorporated by reference in its entirety herein.

BACKGROUND

1. Technical Field

The present disclosure relates to a storage device, and more particularly, to a method of operating a storage device including a nonvolatile memory.

2. Discussion of Related Art

Neural network systems are computing systems inspired by biological neural networks. Such systems learn to perform tasks by considering examples. A neural network of the system may include a plurality nodes that learn inference data by performing a calculation on input data using a certain weight and then passing on the result as an input to one or more of the nodes. The structure of the neural network, the weights, the outputs of the neural network, training features used to train the neural network, and data features input to the neural network can be stored in a storage device of the neural network system. Some of the stored data such as the weights may be updated during the learning or by an external stimulus through a sensor. A data update may be performed using a convolution operation, such as a multiplier-accumulator (MAC) operation. A neuromorphic memory device having a cross-point structure may be included within a neural network system.

The neuromorphic memory can be programmed on a cell-by-cell basis. However, read operations performed by neuromorphic memories are not very efficient.

SUMMARY

At least one exemplary embodiment of the present disclosure provide a method of operating a nonvolatile memory accessible on a memory cell-by-memory cell basis.

At least one exemplary embodiment of the present disclosure also provides a method of operating a nonvolatile memory capable of performing a multiplier-accumulator (MAC) operation.

According to an exemplary embodiment of the present disclosure, there is provided a storage device including a nonvolatile memory device having a plurality of memory cells and a storage controller configured to access the nonvolatile memory device. Each memory cell is set to one of a plurality of memory cell states, wherein distinct subsets of the memory cell states are associated with one of a plurality of data sets. The storage controller accesses data stored in one of the memory cells in a first state, performs a multiplier-accumulator (MAC) operation on the data, and sets the one memory cell to a second state corresponding to a result of the operation to perform an in-place update.

According to an exemplary embodiment of the present disclosure, there is provided a method of operating a storage device including a nonvolatile memory. The method includes receiving an operation command, performing an operation on a value of a memory cell of the nonvolatile memory mapped to a first state according to the operation command to generate a result, determining a second state mapped to the result of the operation and setting the memory cell to the second state for overwriting the value with the result, wherein the nonvolatile memory includes a plurality of memory cells, each memory cell being set to one of a plurality of memory cell states, wherein distinct subsets of the memory cell states are associated with one of a plurality of data sets comprising a plurality of data sets, and each of the data sets includes a plurality of values linearly mapped to one of the subsets, respectively.

According to an exemplary embodiment of the present disclosure, there is provided a neural network device including a memory having a plurality of nonvolatile memory cells, a nonvolatile memory device configured to store a computer program, and a processor. Each memory cell is set to one of a plurality of memory cell states, wherein distinct subsets of the memory cell states are associated with one of a plurality of data sets. The memory stores data. The processor is configured to perform an operation on the data by driving a neural network by executing the program. The processor performs the operation on the data stored in one of the nonvolatile memory cells and mapped to a first state to generate a result and sets the one nonvolatile memory cell to a second state mapped to a result of the operation.

BRIEF DESCRIPTION OF THE DRAWINGS

The inventive concept will become apparent and more readily appreciated from the following description of the embodiments, taken in conjunction with the accompanying drawings in which.

DETAILED DESCRIPTION OF THE EXEMPLARY EMBODIMENTS

Hereinafter, exemplary embodiments of the present disclosure will be described with reference to the accompanying drawings.

Figure 1:
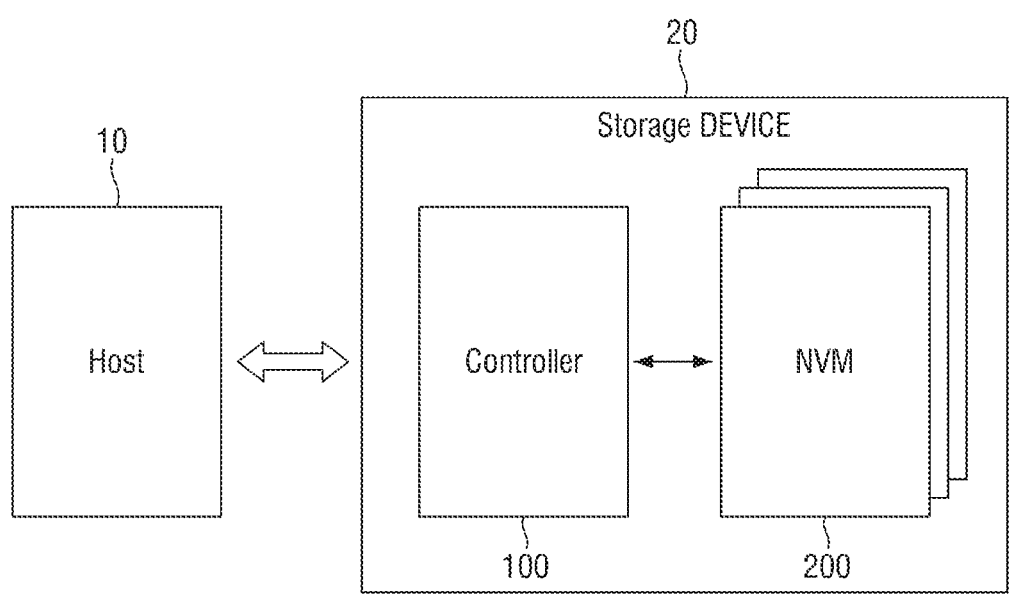
FIG. 1 is a block diagram of a storage device 20 according to an exemplary embodiment of the present disclosure.

FIG. 1 is a block diagram of a storage device 20 according to an exemplary embodiment of the present disclosure.

Referring to FIG. 1, the storage device 20 according to the embodiment of the present disclosure includes a storage controller 100 (e.g., a memory controller) and a nonvolatile memory device 200.

According to some exemplary embodiments, a host 10 (e.g., a host device) connected to the storage device 20 may include portable electronic devices such as personal/portable computers, personal digital assistants (PDAs), portable multimedia players (PMPs) and smartphones, high definition televisions (HDTVs), and the like.

According to some exemplary embodiments, the storage device 20 may be implemented as an internal memory embedded in an electronic device and may be, for example, a universal flash storage (UFS) memory device, an embedded multi-media card (eMMC), or a solid state drive (SSD). In some embodiments, the storage device 20 may be implemented as an external memory that can be inserted into or removed from an electronic device and may be, for example, a UFS memory card, compact flash (CF), secure digital (SD), micro-SD, mini-SD, extreme digital (xD), or a memory stick.

The nonvolatile memory device 200 may be a NAND flash memory, a NOR flash memory, a resistive random access memory (RRAM), a phase-change memory (PRAM), a magnetoresistive random access memory (MRAM), a ferroelectric random access memory (FRAM), or the like.

The storage controller 100 is connected to the host 10 and the nonvolatile memory device 200. The storage controller 100 is configured to provide an interface between the nonvolatile memory device 200 and the host 10. For example, the storage controller 100 provides a control signal CMD and an address ADD to the nonvolatile memory device 200. For example, the control signal CMD could be based on request received from the host 10 such as a read or write request. In addition, the storage controller 100 exchanges data with the nonvolatile memory device 200. For example, the storage controller 100 may receive data and a write request from the host 10 and write the data to the nonvolatile memory device 200. For example, the storage controller 100 may apply a control signal CMD to the nonvolatile memory 200 in response to receiving a read request from the host 10, the nonvolatile memory device 200 may read data in response to the applied control signal CMD and output the read data to the storage controller 100.

In response to a request from the host 10, the storage controller 100 accesses the nonvolatile memory device 200. The storage controller 100 may control read, write (or program), erase, and background operations of the nonvolatile memory device 200. For example, to control the read operation, the storage controller 100 may transmit a read control signal $CMD_{read}$ and the address ADD to the nonvolatile memory device 200. For example, to control the write operation, the storage controller 100 may transmit a write control signal $CMD_{write}$ and data to be written. For example, to control the erase operation, the storage controller 100 may transmit an erase control signal $CMD_{erase}$ and the address ADD. In addition, the storage controller 100 may perform background operations such as wear leveling, garbage collection and bad block managing on the nonvolatile memory device 200. For example, the wear leveling may include ensuring that no memory block is written more than a certain number of times. For example, the garbage collection may include copying valid pages of a several memory blocks to a single memory block and then erasing the several blocks to free up space. For example, the bad block managing may include keeping track of memory blocks storing codewords that could not be corrected and avoiding use of these memory blocks for future write operations.

In some embodiments, the storage controller 100 may control the nonvolatile memory device 200 to read data by applying the same read voltage to a selected word line. The nonvolatile memory device 200 may read stored data using the read voltage having a predetermined threshold voltage and transfer the read data to the storage controller 100 whenever the data is read. The read data may be transferred to the storage controller 100 on a page-by-page basis. For example, the nonvolatile memory device 200 could include a page buffer, overwrite the page buffer with a next page of the read data, output the contents of the page buffer to the storage controller 100, and repeat this until all of the read data has been transferred to the storage controller 100.

In an exemplary embodiment, the storage controller 100 may access a first state of data stored in a memory cell, perform an operation on a value mapped to the first state, and in-place update the result of the operation to a second state. In the present specification, an in-place update may refer to a case where a memory cell in which data before an operation is stored is the same as a memory cell in which the data after the operation is written (programmed or updated). In an exemplary embodiment, an in-place update overwrites a memory cell that is already storing data without first erasing the memory cell.

Figure 2:
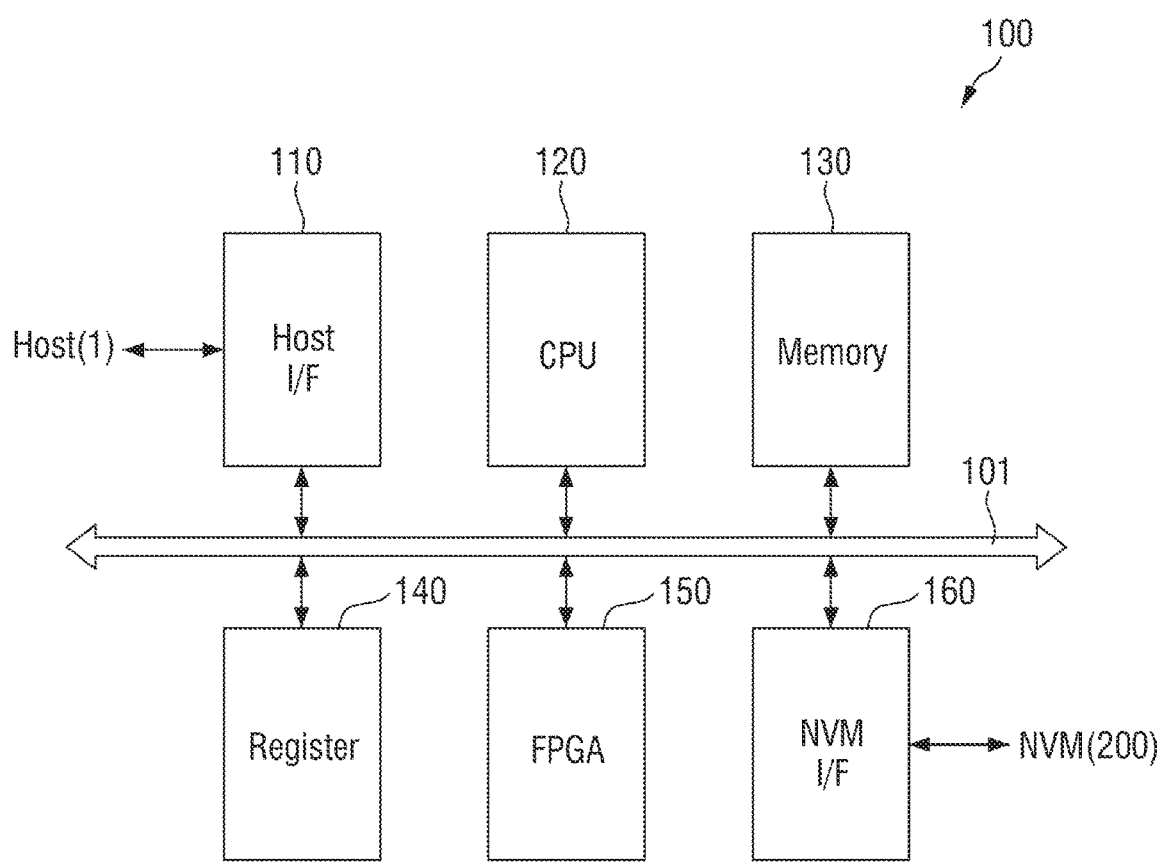
FIG. 2 is a block diagram of the storage controller 100 illustrated in FIG. 1.

FIG. 2 is a block diagram of the storage controller 100 illustrated in FIG. 1.

Referring to FIG. 2, the storage controller 100 according to an exemplary embodiment includes a host interface 110, a processing unit 120, a memory 130, a register 140, a programmable logic 150, and a nonvolatile memory interface 160.

The elements of the storage controller 100 are connected to each other through a data bus 101. The data bus 101 may include a plurality of channels. In an exemplary embodiment, the channels may indicate communication paths driven independently of each other and respectively communicate with connected devices based on the same communication method.

The host interface 110 may be connected to the host 100. According to an exemplary embodiment, the host interface 110 may be based on at least one of various interfaces such as double data rate (DDR), low-power DDR (LPDDR), universal serial bus (USB), multimedia card (MMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), mobile industry processor interface (MIPI), nonvolatile memory-express (NVM-e), and universal flash storage (UFS).

The processor 120 may perform an operation control and an operation on each element of the storage controller 100 in response to a write command, a read command, an erase command or other commands related to the operation of the storage device 20 received from the host 10. According to an exemplary embodiment of the inventive concept, the processor 120 performs a multiplier-accumulator (MAC) operation for a convolution operation necessary for a neural network. In an exemplary embodiment, a MAC operation includes a multiply operation and an addition operation. For example, a first weight of a node of an artificial neural network associated with a first input edge can be multiplied by first data input received through the first edge to generate a first result using a multiplier of the MAC operation, a second weight of the node associated with a second input edge can be multiplied by second data input received through the second edge to generate a second result using the multiplier, and the first and second results can be added together to generate an output of the node using an accumulator of the MAC operation.

The memory 130 stores nonvolatile data necessary for the operation of the storage controller 100. According to some embodiments, the memory 130 may include a cache, a read only memory (ROM), a programmable read only memory (PROM), an erasable PROM (EPROM), an electrically erasable programmable read only memory (EEPROM), a phase-change RAM (PRAM), a flash memory, a static RAM (SRAM), or a dynamic RAM (DRAM).

The register 140 may be a working memory that temporarily stores write data received from the host 10 or read data received from the nonvolatile memory device 200 and operation results generated during a control operation of the processing unit 120. The register 140 may also be referred to as a buffer memory.

The programmable logic 150 may perform some of the operations performed by the processing unit 120. For example, some operation of the processing unit 120 may be offloaded to the programmable logic 150. According to an exemplary embodiment of the inventive concept, the programmable logic 150 is a programmable logic device (PLD) including a plurality of gate arrays. The PLD may be used to design a digital circuit that performs a specific operation.

The nonvolatile memory interface 160 may also be referred to as a nonvolatile memory controller and may access the nonvolatile memory 200 to control the operation of each of a plurality of nonvolatile memories. In an exemplary embodiment, the nonvolatile memory interface 160 may be connected to the nonvolatile memory 200 through at least one channel to write, read or erase data.

The nonvolatile memory device 200 is provided as a storage medium of the storage device 20. For example, the nonvolatile memory device 200 may be configured as a NAND-type flash memory having a large storage capacity.

Figure 3:
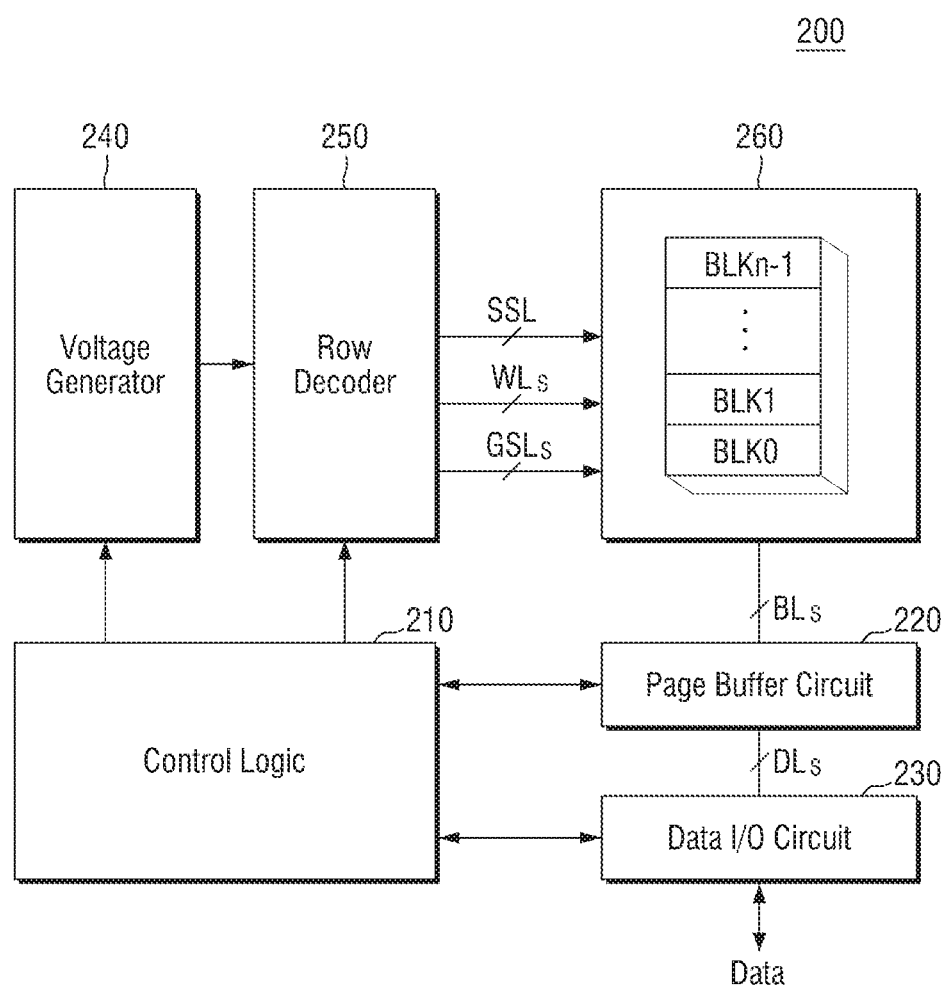
FIG. 3 is a block diagram illustrating the nonvolatile memory device 200 of FIG. 1 in more detail.

FIG. 3 is a block diagram illustrating the nonvolatile memory device 200 of FIG. 1 in more detail.

Referring to FIG. 3, the nonvolatile memory device 200 according to an exemplary embodiment of the present disclosure includes a memory cell array 260, a control logic 210, a row decoder 250, a page buffer 220, and an input/output buffer 230.

The memory cell array 260 includes a plurality of memory blocks BLK0 through BLKn-1. Each of the memory blocks BLK0 through BLKn-1 includes a plurality of pages. Each of the pages includes a plurality of memory cells. Each of the memory cells is disposed at an intersection of a word line WL and a bit line BL.

The memory cell array 260 may include a memory cell region corresponding to a main memory and a flag cell region.

In the main memory that stores data, each memory cell may be a multi-level cell that stores two or more bits of data. Each memory cell may store a plurality of bit data. Each memory cell may include one or more data sets. Each data set may include two or more states to be mapped.

According to an exemplary embodiment of the inventive concept, when receiving an operation command from the host 10, the storage controller 100 performs an operation on a value of one of the memory cells in a first state to generate a result and sets the one memory cell to a second state corresponding to the result of the operation to perform an in-place update. Here, the second state may belong to the same memory cell as the first state but may also belong to the same data set as a data set to which the first state belongs or may belong to a data set adjacent to the data set to which the first state belongs. This will be described in detail later with reference to FIGS. 7A and 7B.

According to an exemplary embodiment of the inventive concept, the memory cell array 260 includes flag cells that store various information about the memory cells.

According to some embodiments, a flag cell may include one or more states corresponding to the number of data sets included in a memory cell. For example, if there are three data sets, the flag cell may include four states including an erase state and may be 2 bit-flag data corresponding to the four states.

According to an exemplary embodiment of the inventive concept, a flag cell includes degradation information of a plurality of states included in a memory cell. The degradation information flag cell may be flag data of one or more bits.

The control logic 210 controls the overall operation of the nonvolatile memory device 200. The control logic 210 may be configured to control a high voltage generator 240. That is, the control logic 210 may control the high voltage generator 240 to generate high voltages necessary for write, read and erase operations in response to the control signal CMD from the storage controller 100 (see FIG. 1). For example, during a read operation, the control logic 210 applies a read voltage Vrd and a read pass voltage Vread to the memory cell array 260 through the row decoder 250. In addition, the control logic 210 transfers the address ADD received from the storage controller 100 (see FIG. 1) to each of the row decoder 250 and the page buffer 220.

The page buffer 220 operates as a write driver or a sense amplifier depending on operation mode. For example, the page buffer 220 operates as a sense amplifier during a read operation. During a read operation, the page buffer 220 receives one page of data from the memory cell array 260. Specifically, the page buffer 220 receives one page of least significant bit (LSB) data or most significant bit (MSB) data corresponding to a page address from the memory cell array 260.

The input/output buffer 230 is configured to exchange data with an external device. Data received from the external device is transferred to the page buffer 220 through data lines DL. Data received from the page buffer 220 is output to the external device (e.g., the storage controller 100). For example, the input/output buffer 230 may transfer read data to the storage controller 100. For example, the input/output buffer 230 may include a well-known element such as a data buffer.

A first memory block BLK0 in the memory cell array 260 includes a plurality of memory cell groups (not illustrated). Memory cells disposed in one row may form one memory cell group (e.g., a page). In addition, the memory cell group may be connected to one of the word lines WL.

For example, the first memory block BLK0 may include first through $m^{th}$ pages Page 1 through Page M. Each of the pages Page 1 through Page M may include first through $k^{th}$ sectors sector 1 through sector k. Each of the sectors sector 1 through sector k includes a plurality of memory cells sharing one word line (not illustrated). Each of the memory cells may be a multi-level cell that stores a plurality of bits.

Although only the first memory block BLK0 is illustrated in FIG. 3, all of the first through $n^{th}$ memory blocks BLK0 through BLKn-1 may be configured identically. In the case of a NAND flash memory, read and write operations are performed on a cell-by-cell basis in an in-place update method.

Figure 4:
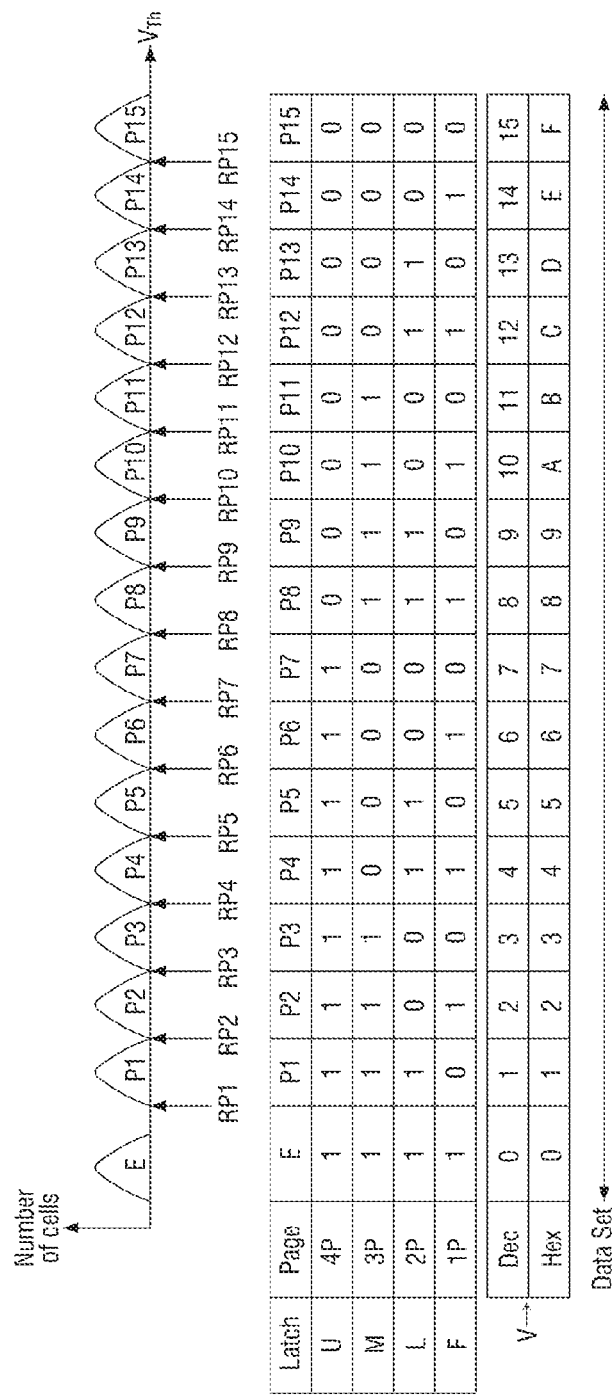
FIG. 4 illustrates various methods of mapping dispersions of memory cells.
Figure 5:
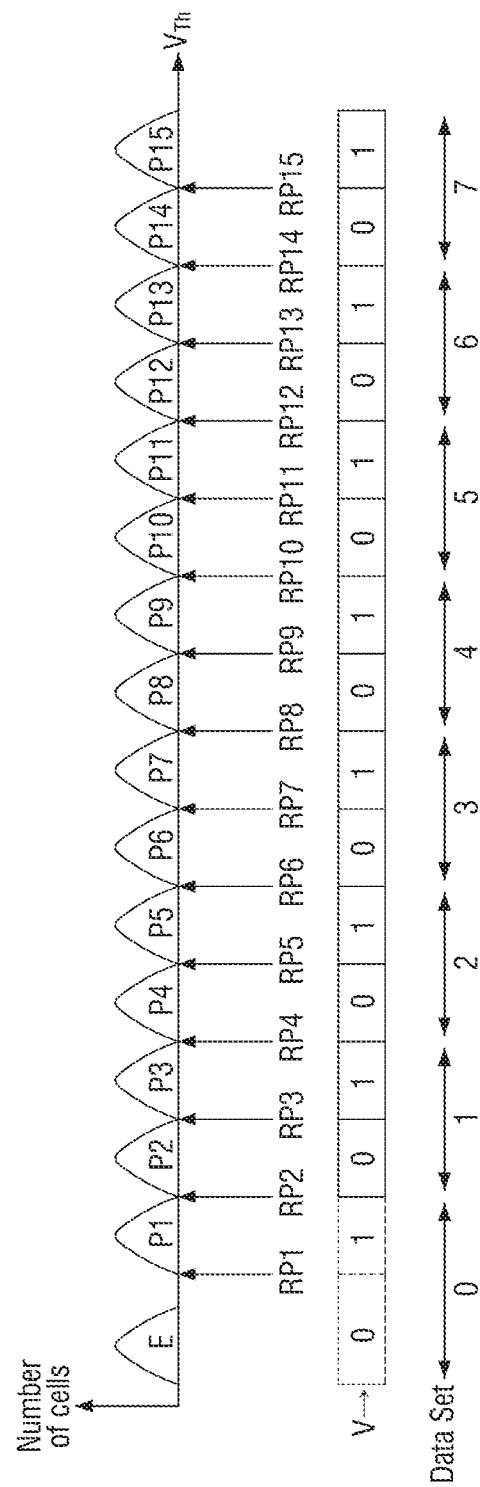
FIGS. 5 and 6 illustrate linear mapping values of a memory cell according to an exemplary embodiment of the inventive concept.
Figure 6:
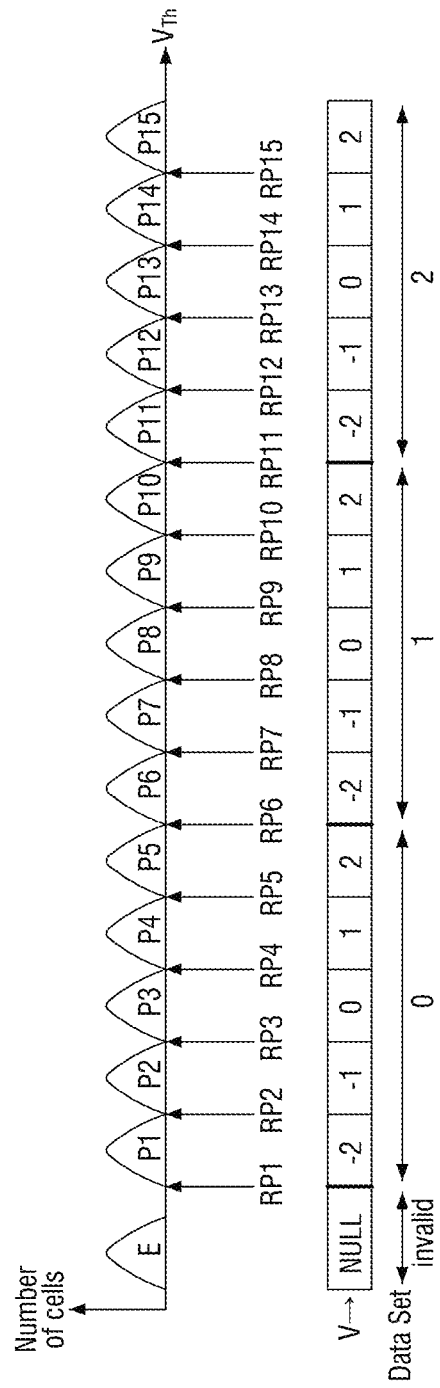

FIG. 4 illustrates various methods of mapping dispersions of memory cells. FIGS. 5 and 6 illustrate linear mapping values of a memory cell according to an exemplary embodiment of the inventive concept.

In the illustrated embodiments, it is assumed that one memory cell is a quadruple-level cell (QLC) capable of storing 4 bits. However, this is merely an exemplary embodiment, and the present disclosure is not limited thereto. Embodiments of the present disclosure are applicable to any multi-level cell that stores two or more bits of data.

Referring to FIG. 4, when a memory cell is a 4-bit multi-level cell, the memory cell may be in one of an erase state E and first through fifteenth states P1 through P15 and may be programmed (written) to any one of the states. The horizontal axis of FIG. 4 represents threshold voltages of memory cells, and the states may be divided by threshold voltages RP1 through RP15, respectively. That is, results of programming in the erase state E and the first through fifteenth states P1 through P15 during a program operation may be divided by sequentially applying the threshold voltages RP1 through RP15 to a selected word line.

When a first read voltage RP1 is applied to a control gate of a memory cell, the memory cell is turned on if it is in the erase state E, but is turned off if it is in the first state P1. When the memory cell is turned on, a current flows through the memory cell. When the memory cell is turned off, no current flows through the memory cell. Therefore, data stored in a memory cell may be distinguished according to whether the memory cell is turned on.

Logic level allocation of data may vary according to embodiments. According to some embodiments, when a memory cell is turned on by applying the first read voltage RP1, data '1' may be stored, and when the memory cell is turned off, '0' may be stored. Alternatively, according to an embodiment, when a memory cell is turned on, data '0' may be stored, and when the memory cell is turned off, '1' may be stored.

In the case of a QLC, data including 4 bits may be allocated to each state as illustrated in the drawing. In an embodiment, data '1111' may be allocated to the erase state E, and data '1110' may be allocated to the first state P1. However, data allocated to each state is not limited to the illustrated example and can be changed and then allocated accordingly.

A plurality of bit pages may be included for data access to a multi-level cell. A QLC may be divided into four bit pages 1P through 4P to output data. The bit pages 1P through 4P may output data through page buffers U, M, L and F, respectively.

States of one memory cell may be expressed using various linear mapping methods. A value mapped to each state is a linear value. That is, the erase state E and the first through $n^{th}$ states P1 through Pn may have values that sequentially and constantly increase. Alternatively, the memory cell may be linearly mapped in a way that includes one or more data sets. Each of the data sets may include two or more states.

The storage controller 100 performs a write operation in a direction from a low threshold voltage to a high threshold voltage. Therefore, the storage controller 100 may store the result of the operation only in a right direction. That is, assuming that a value before the operation is stored in a first state and a value after the operation is stored in a second state, the second state may have a greater threshold voltage than the first state. In other words, the second state may be disposed at a position shifted to the right of the first state. The second state is not shifted to the left due to the nature of the write (program) operation of a nonvolatile memory.

Each of a plurality of states of a memory cell may be mapped to a decimal number, a hexadecimal number, or a value of some other number system according to some embodiments.

The states of a memory cell illustrated in FIG. 4 may be respectively linearly mapped to values of 0 to 15 as decimal numbers (DEC) according to some embodiments or may be respectively linearly mapped to values of 0 to 9 and A to F as hexadecimal numbers (HEX) according to some embodiments. In this case, since the values (0 to 15) mapped to the decimal numbers or the values mapped to the hexadecimal numbers do not overlap each other, they may refer to one data set.

Alternatively, referring to an embodiment illustrated in FIG. 5, a memory cell may be linearly mapped to eight data sets, each including two states mapped to 0 and 1, respectively. The values of 0 and 1 in a data set are linear values, and set numbers 0 through 7 of data sets 0 through 7 may also increase linearly with each other.

Alternatively, referring to an embodiment illustrated in FIG. 6, the fifteen states of a memory cell excluding the erase state E may be mapped to three data sets −2 through 2, each including five linear values. In this case, since the erase state E not included in the data sets is a state before the memory cell is programmed, it may be mapped to Invalid.

Each data set of FIG. 6 includes five values. Values respectively mapped to states included in one data set may be variously set. For example, while the values are set to 2, −1, 0, 1 and 2 in FIG. 6, a data set could instead be set to 0, 1, 2, 3 and 4. However, the present disclosure is not limited thereto, and the values may also be mapped to other linear values required according to system design.

A storage device according to an exemplary embodiment of the present disclosure can perform a write operation on a nonvolatile memory on a cell-by-cell basis by mapping a plurality of data sets having a plurality of values to a plurality of states of a memory cell and performing an operation based on the mapped values.

Figure 7A:
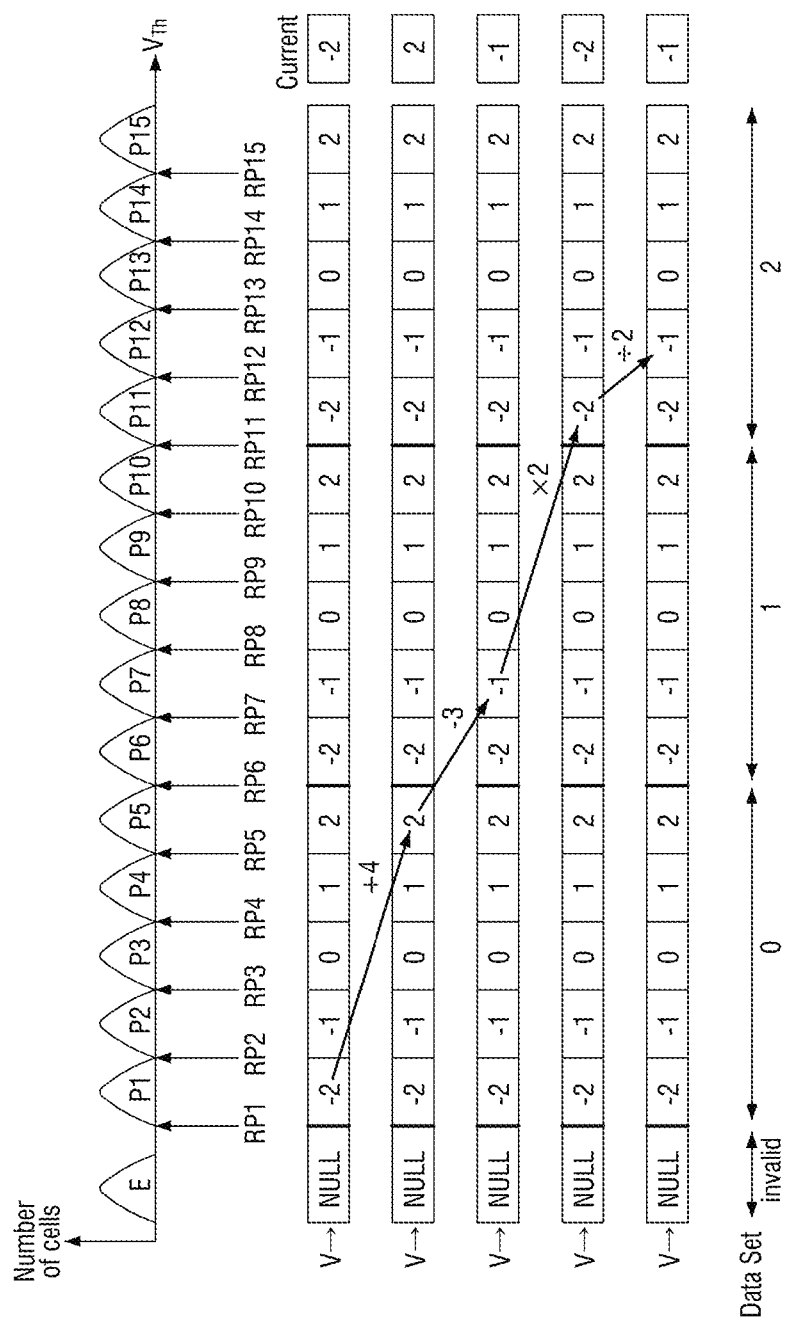
FIGS. 7A and 7B are diagrams for explaining a method of operating a storage device according to an exemplary embodiment of the inventive concept.
Figure 7B:
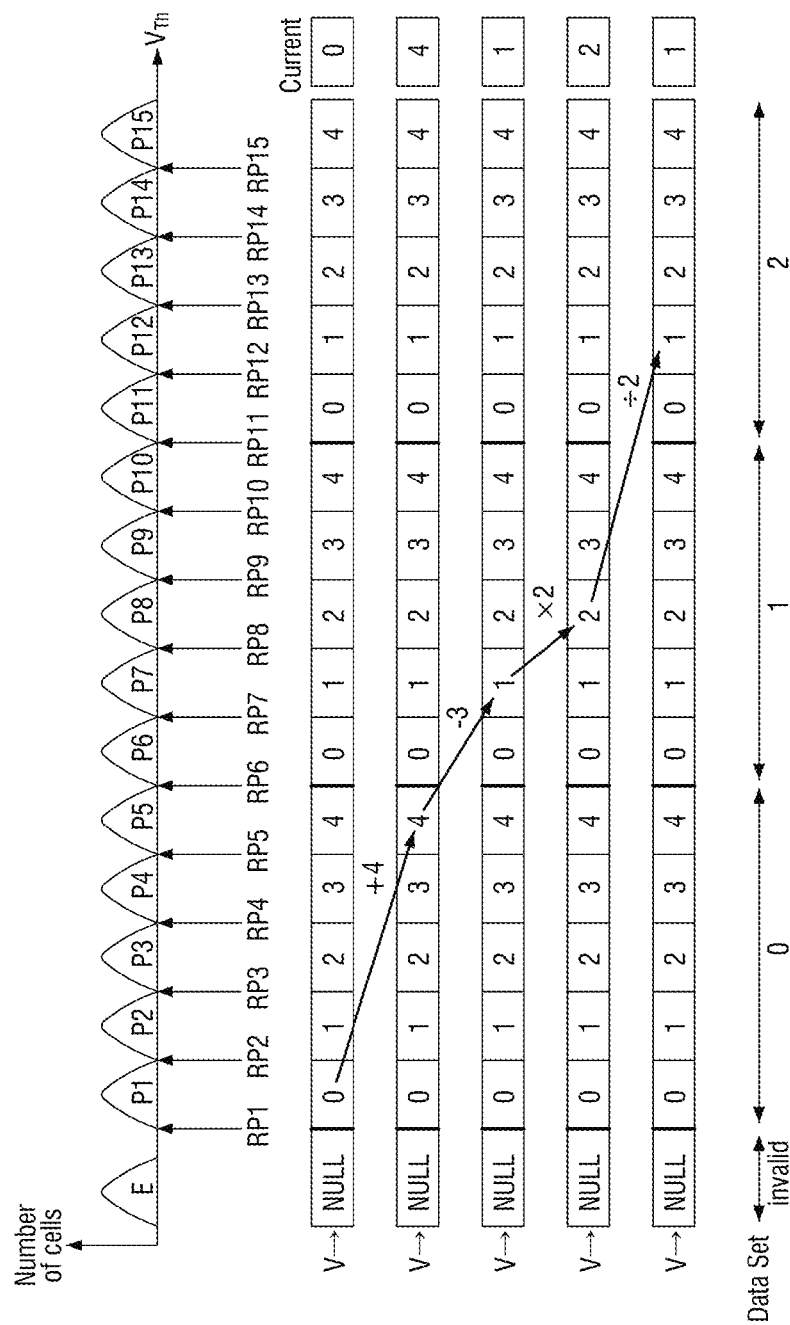

FIGS. 7A and 7B are diagrams for explaining a method of operating a storage device according to an exemplary embodiment of the inventive concept.

Referring to FIG. 7A, in the illustrated example, values V in one data set may be set to −2, −1, 0, 1 and 2 and may be respectively linearly mapped to states P except for an erase state. For example, data set 0, data set 1 and data set 2 may be sequentially mapped to states P1 through P15 in this direction. Specifically, data set 0 is mapped to states P1 through P5, data set 1 is mapped to states P6 through P10, and data set 2 is mapped to states P11 through P15. In addition, the values V of −2, −1, 0, 1 and 2 are respectively mapped to states P1 through P5, states P6 through P10, or states P11 through P15 in each data set.

The storage device first starts an operation in state P1. For example, a memory cell is in state P1 prior to starting the operation and state P1 is associated with data set 0. A current value mapped to state P1 is −2. For example, the memory cell could be interpreted as storing a value of −2 prior to the operation. Adding (+) 4 in state P1 results in a value of 2, causing a shift to state P5 mapped to the value of 2. For example, if the operation includes adding 4 to the value stored in the memory cell, a first voltage could be applied to the memory cell through a bit line to set the memory cell to state P5, which is associated with data set 0. Subtracting (−) 3 from the value of 2 in a next operation results in a value of −1. For example, if the operation further includes subtracting 3 from the value of 2 stored in the memory cell, a second voltage higher than the first voltage could be applied to the memory cell through a bit line to set the memory cell to state P7, which is associated with data set 1. Due to the programming nature of a nonvolatile memory, the storage device shifts to state P7 of a next adjacent data set 1 instead of shifting to state P2 mapped to the value of −1.

If the value of −1 is multiplied by 2 in a next operation, the current value becomes −2. The storage device shifts to state P11 of a next adjacent data set 2 mapped to the current value of −2. For example, if the operation further includes multiplying 2 by the value of −1 stored in the memory cell, a third voltage higher than the second voltage could be applied to the memory cell through a bit line to set the memory cell to state P11, which is associated with data set 2. If the value of −2 is divided by 2 in a next operation, the current value becomes −1. Since values in the same data set are mapped in an increasing direction, the storage device shifts to state P12. For example, if the operation further includes dividing the value of −2 stored in the memory cell by 2, a fourth voltage higher than the third voltage could be applied to the memory cell through a bit line to set the memory cell to state P11, which is associated with data set 2.

Referring to FIG. 7B, in the illustrated example, values V in one data set may be set to 0, 1, 2, 3 and 4 and may be respectively linearly mapped to states P except for an erase state. For example, data set 0, data set 1 and data set 2 may be sequentially mapped to states P1 through P15 in this direction. Specifically, data set 0 may be mapped to states P1 through P5, data set 1 may be mapped to states P6 through P10, and data set 2 may be mapped to states P11 through P15. In addition, the values V of 0, 1, 2, 3 and 4 may be respectively mapped to states P1 through P5, states P6 through P10, or states P11 through P15 in each data set.

The storage device first starts an operation in state P1. A current value mapped to state P1 is 0. Adding (+) 4 in state P1 results in a value of 4, causing a shift to state P5 mapped to the value of 4. Subtracting (−) 3 from the value of 4 in a next operation results in a value of 1. Due to the programming nature of a nonvolatile memory, the storage device shifts to state P7 of a next adjacent data set 1 instead of shifting to state P2 mapped to the value of 1.

If the value of 1 is multiplied by 2 in a next operation, the current value becomes 2. The storage device shifts to state P8 mapped to the current value of 2. If the value of 2 is divided by 2 in a next operation, the current value becomes 1. Since values in the same data set cannot be mapped in an increasing direction, the storage device shifts to state P12.

That is, the storage device may perform an operation on a value mapped to each state, check position information of a second state to which a result value of the operation is mapped, and update the position information of the second state. Here, it is checked whether the result value is the second state in the increasing direction from the value of a first state. Then, the result value is written (updated or overwritten) to the second state.

In an exemplary embodiment, when the control logic 210 is instructed to update a memory cell from a first value to a second value, the control logic 210 determines a current data set associated with the memory cell, determines a current state of the memory cell within the current data set (e.g., determines current position of current state within current data state), determines whether the memory cell can be shifted right from the current state (e.g., current position) to a new first state (e.g., a new first position) within the current data set to set the memory cell to the second value, and applies an appropriate voltage to the memory cell to set the memory cell to the new first state upon determining that the memory cell can be shifted right to the new first state. For example, if the memory cell is currently in state P1 and is to be updated to −1, since the current data set is 0 and a shift right from state P1 within data set 0 is capable of reaching state P2 having a value of −1, the control logic 210 can apply an appropriate voltage to the memory cell to set the memory cell to state P2. If the control logic 210 determines that the memory cell cannot be shifted right to the new first state within the current data set to set the memory cell to the second value, the control logic 210 determines a new second state (e.g., a new second position) within the next data set to set the memory cell to the second value and applies an appropriate voltage to the memory cell to set the memory cell to the new second state. For example, if memory cell is in state P2 and is to be updated to −2, since the current data set is 0 and a shift right within data set 0 is not capable of reaching a −2, the control logic 210 determines that state P6 within next data set 1 allows the memory cell to be set to −2, and thus the control logic 210 can apply an appropriate voltage to the memory cell to set the memory cell to state P6.

Figure 8:
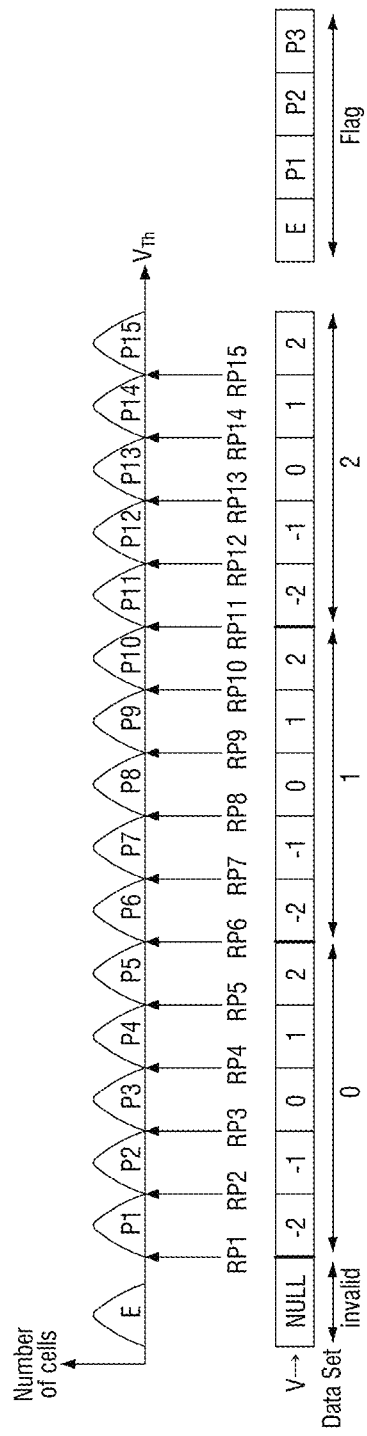
FIG. 8 illustrates a memory cell and a flag cell of a storage device according to an exemplary embodiment of the inventive concept.
Figure 9:
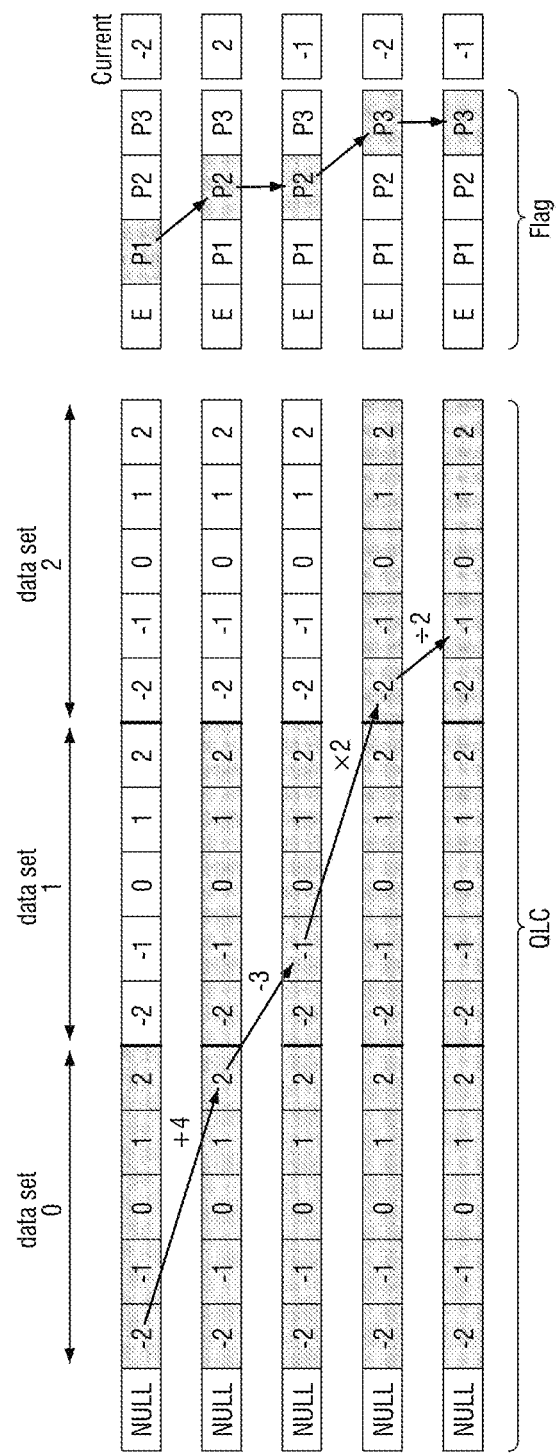
FIG. 9 is a diagram for explaining a method of operating the storage device illustrated in FIG. 8 according to an exemplary embodiment of the inventive concept.

FIG. 8 illustrates a memory cell and a flag cell of a storage device according to an exemplary embodiment of the inventive concept. FIG. 9 is a diagram for explaining a method of operating the storage device illustrated in FIG. 8 according to an exemplary embodiment of the inventive concept.

Referring to FIG. 8, a nonvolatile memory device may include a memory cell region and a flag cell region.

The flag cell region may store state information corresponding to each memory cell. A flag cell may be a multi-level cell according to some embodiments. According to some embodiments, the state information may include at least one of operation information, and degradation information of each memory cell.

The operation information is information indicating whether a state storing a current value is included in a data set belonging to a memory cell. More specifically, the operation information is information indicating whether the current value has passed through the data set.

The operation information flag cell may include a number of bits corresponding to the number of data sets included in a memory cell. In the case of a QLC illustrated in the drawing, since there are three data sets, the operation information flag cell may be 2 bits. Specifically, data set 0 may correspond to flag cell state P1, data set 1 may correspond to flag cell state P2, and data set 2 may correspond to flag cell state P3.

The degradation information is information indicating the degree to which each memory cell has been degraded according to its operation. That is, the degradation information is log information about the progress of degradation and may include, for example, a program/erase (PE) cycle, a read count, a retention time, a program time and a program/read temperature, but the degradation information according to the current embodiment is not limited thereto.

In an embodiment, a flag cell for the PE cycle may be one or more bits. In a memory cell, a data set to which a state belongs in which the number of PE cycles exceeds a predetermined value (>A) may be determined to be invalid, and the other data sets may be determined to be valid. In this state, the memory cell may be driven.

Flag cell states when operations are performed in FIG. 8 will now be described in more detail. First, for the current value of −2 (P1), only flag cell state P1 corresponding to data set 0 to which state P1 of a memory cell (QLC) belongs is updated to 1, and flag cell states P2 and P3 are updated to 0.

In a first operation, if 4 is added to the current value of −2 (P1), the current value becomes 2 (P5). In consideration of the aging of the memory cell, flag cell states P1 and P2 corresponding to data set 0 and data set 1 before and after memory cell state P5 are updated to 1, and flag cell state P3 is updated to 0.

In a second operation, if 3 is subtracted from the current value of 2 (P5), the current value becomes −1 (P7), flag cell states P1 and P2 corresponding to data set 1 to which memory cell state P7 belongs are updated to 1, and flag cell state P3 is updated to 0.

In a third operation, if the current value of −1 (P7) is multiplied by 2, the current value becomes −2 (P11), and flag cell states P1, P2 and P3 corresponding to data set 2 to which memory cell state P11 belongs are updated to 1.

In a fourth operation, if the current value of −2 (P11) is divided by 2, the current value becomes −1 (P12), and flag cell states P1, P2 and P3 corresponding to data set 2 to which memory cell state P12 belongs are updated to 1.

Although the state information of the flag cell illustrated in FIG. 8 is 1 when a data set is activated and 0 when the data set is not activated, it may also be mapped differently according to other embodiments.

That is, the flag cell may determine the range of read voltages in a read operation on a nonvolatile memory. When the storage device accesses the current value to perform an operation, it only has to check the flag cell and then apply a threshold voltage value corresponding to data set 1 corresponding to flag cell state P1. Therefore, the efficiency of the read operation can be improved.

Figure 10:
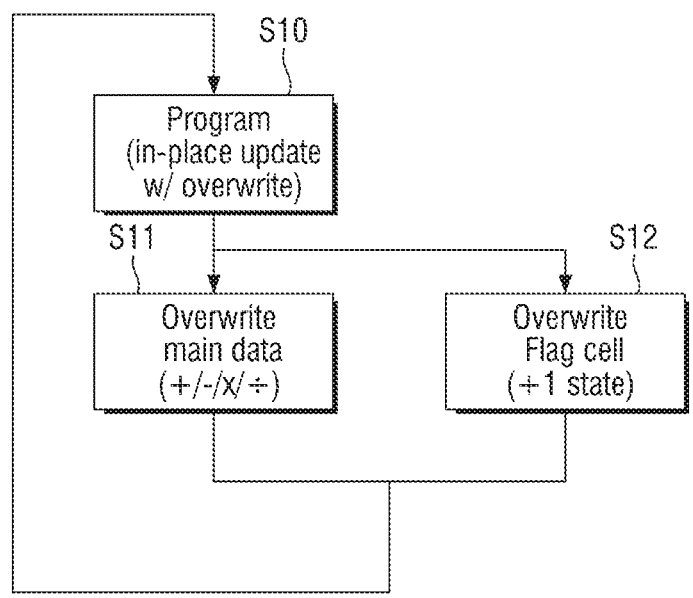
FIGS. 10 through 12 are flowcharts illustrating a method of operating a storage device according to an exemplary embodiment of the inventive concept.
Figure 11:
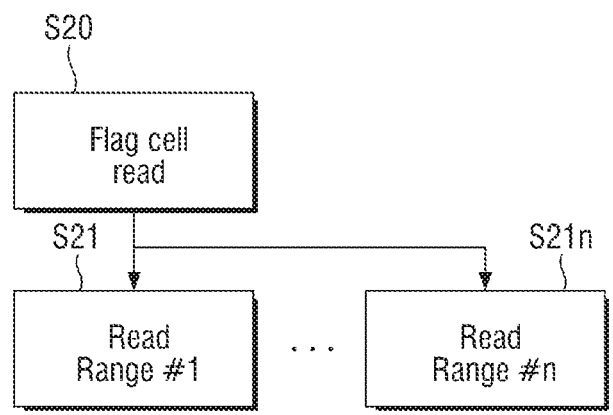
Figure 12:
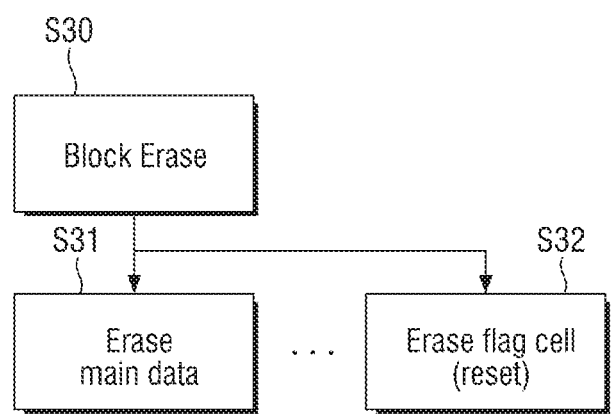

FIGS. 10 through 12 are flowcharts illustrating a method of operating a storage device according to an exemplary embodiment of the inventive concept.

The storage device may perform an operation based on a value mapped to each state of a memory cell and write (or overwrite) the result of the operation to the memory cell. That is, the storage device may write data to a nonvolatile memory device on a cell-by-cell basis, in other words, may in-place update data to a corresponding memory cell.

Referring to FIG. 10, in the case of a write operation, when the storage device performs an operation on a current value of a memory cell in a first state to generate a result and receives a write (program) command for writing the result of the operation (operation S10), the memory device performs a write operation on the memory cell to set the memory cell to a second state corresponding to the result of the operation (operation S11). The storage device updates a state of a flag cell corresponding to a data set to which the second state belongs (operation S12).

Referring to FIG. 11, in the case of a read operation, when the storage device intends to read a current value of a memory cell in a first state, the storage device first reads a flag cell corresponding to a memory cell indicated by an address received together with a read command (operation S20). After checking data set activation information in the flag cell, the storage device accesses the memory cell by applying a read voltage within a threshold voltage range of an activated data set (operations S21 through S21n). For example, if the threshold voltage range includes several read voltages, the storage device may apply one or more of these voltages to the memory cell.

Referring to FIG. 12, in the case of an erase operation, the storage device sets a memory cell to an erase state E. Therefore, the storage device erases a memory cell (operation S31) while resetting a flag cell corresponding to the memory cell to the erase state E.

That is, according to the embodiment of FIGS. 10 through 12, when the storage device performs a read, write, or erase operation on a memory cell, it may update information about the operation to a corresponding flag cell.

Figure 13:
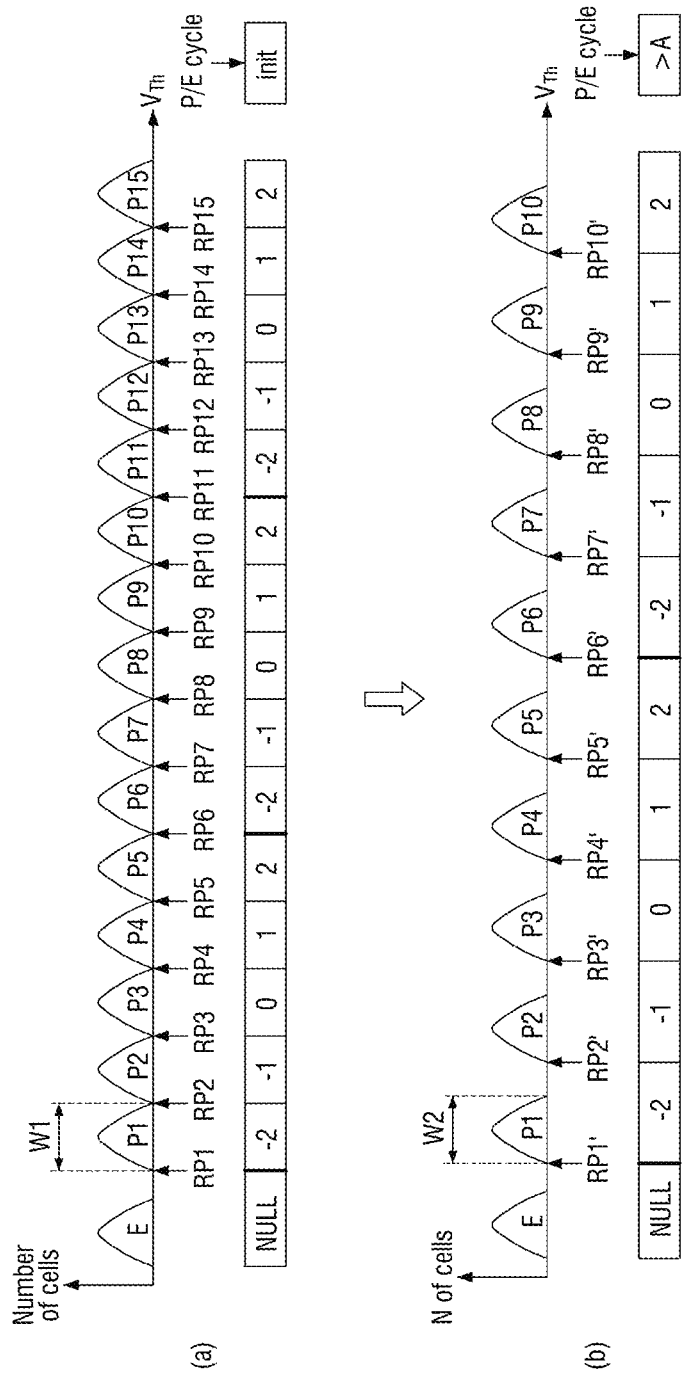
FIG. 13 is a diagram for explaining a method of operating a storage device when a nonvolatile memory device is degraded according to an exemplary embodiment of the inventive concept.

FIG. 13 is a diagram for explaining a method of operating a storage device when a nonvolatile memory device is degraded according to an exemplary embodiment of the inventive concept.

Referring to FIG. 13, degradation information may be stored in a flag cell region.

According to some embodiments, the degradation information may be a single-level cell or a multi-level cell.

As for the PE cycle as an embodiment of the degradation information, a flag cell corresponding to the PE cycle may have a corresponding bit for each data set. The degradation information flag cell may be stored as 0 when the number of PE cycles for a memory cell is less than a predetermined number A and may be written as 1 when the number of PE cycles exceeds the predetermined number A.

In the illustrated embodiment, when the number of PE cycles for data set 2 exceeds the predetermined number A, the storage device writes 1 to the flag cell as the degradation information for data set 2.

The storage device reads the degradation information flag cell first and then accesses a corresponding memory cell to perform a read, write or erase operation.

For example, in a read operation, the storage device may disable all states P11 through P15 belonging to data set 2 based on the degradation information flag cell and re-map threshold voltages and data sets to the other states E and P0 through P10. Since a gap between the threshold voltages is very small in the case of a multi-level cell, if the threshold voltages are mapped to the remaining states except for the disabled states, the gap between the threshold voltages may be increased, thereby improving read reliability (W1<W2).

Figure 14:
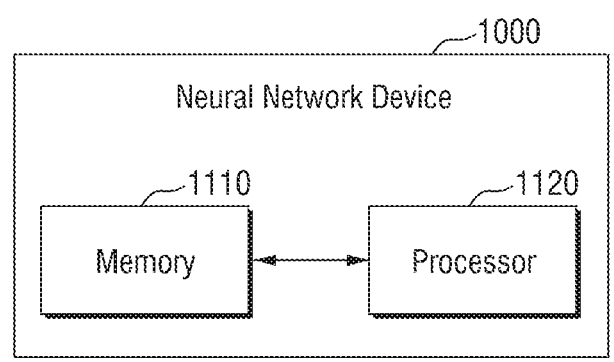
FIG. 14 illustrates an example in which a storage device according to an exemplary embodiment of the inventive concept is applied to a neural network device 1000.

FIG. 14 illustrates an example in which a storage device according to an exemplary embodiment of the inventive concept is applied to a neural network device 1000.

Referring to FIG. 14, the neural network device 1000 may be implemented as various types of devices such as a personal computer, a server device, a mobile device, and an embedded device. Specifically, the neural network device 1000 may be, but is not limited to, a smartphone, a tablet device, an augmented reality (AR) device, an Internet of things (IoT) device, an autonomous vehicle, robotics, or a medical device that performs voice recognition, image recognition, image classification, etc. using a neural network. Further, the neural network device 1000 may be, but is not limited to, a dedicated hardware accelerator mounted on the above devices or a hardware accelerator such as a neural processing unit (NPU), a tensor processing unit (TPU) or a neural engine that is a dedicated module for driving the neural network.

The neural network device 1000 includes a processor 1120 and a memory 1110. In the neural network device 1000, only the elements related to the current embodiments are illustrated. Therefore, one of ordinary skill in the art would understand that other general-purpose elements can be included in addition to the elements illustrated in FIG. 14.

The processor 1120 controls overall functions for executing the neural network device 1000. For example, the processor 1120 controls the overall operation of the neural network device 1000 by executing programs stored in the memory 1110 of the neural network device 1000. The processor 1120 may be implemented as a central processing unit (CPU), a graphics processing unit (GPU), or an application processor (AP) included in the neural network device 1000, but the present disclosure is not limited thereto.

The memory 1110 is hardware that stores various data processed in the neural network device 1000. For example, the memory 1110 may store data processed by the neural network device 1000 and data to be processed. In addition, the memory 1110 may store applications, drivers, etc. to be driven by the neural network device 1000. According to some embodiments, the memory 1110 may be the nonvolatile memory device 200 illustrated in FIG. 1. According to an embodiment, the memory 1110 as a nonvolatile memory may include a random access memory (RAM) such as a DRAM or an SRAM, a ROM, an EEPROM, a CD-ROM, a Blu-ray or other optical disk storage, a hard disk drive (HDD), an SSD, or a flash memory.

The processor 1120 may read/write neural network data such as image data, feature map data or kernel data from/to the memory 1110 and execute the neural network (e.g., an artificial neural network) using the read/written data. When the neural network is executed, the processor 1120 may repeatedly perform a convolution operation between an input feature map and a kernel in order to generate data about an output feature map. The processor 1120 may operate similarly to the storage controller 100 illustrated in FIG. 1. The processor 1120 may perform a very large number (operation count) of convolution operations ranging from hundreds of millions to tens of billions, and the number of times that the processor 1120 accesses the memory 1110 to perform a convolution operation may increase dramatically.

The neural network device 1000 according to an embodiment may include neuromorphic hardware. The neuromorphic hardware may be disposed separately from the memory 1110 or may be part of the memory 1110 according to some embodiments. The neuromorphic hardware may perform convolutional neural network (CNN) mapping. The neuromorphic hardware may perform an operation using only an on-chip memory without using an external memory. For example, the neuromorphic hardware may perform CNN mapping using only an on-chip memory without using an external memory (e.g., an off-chip memory). Therefore, it may perform an operation without a memory update during image processing.

Figure 15:
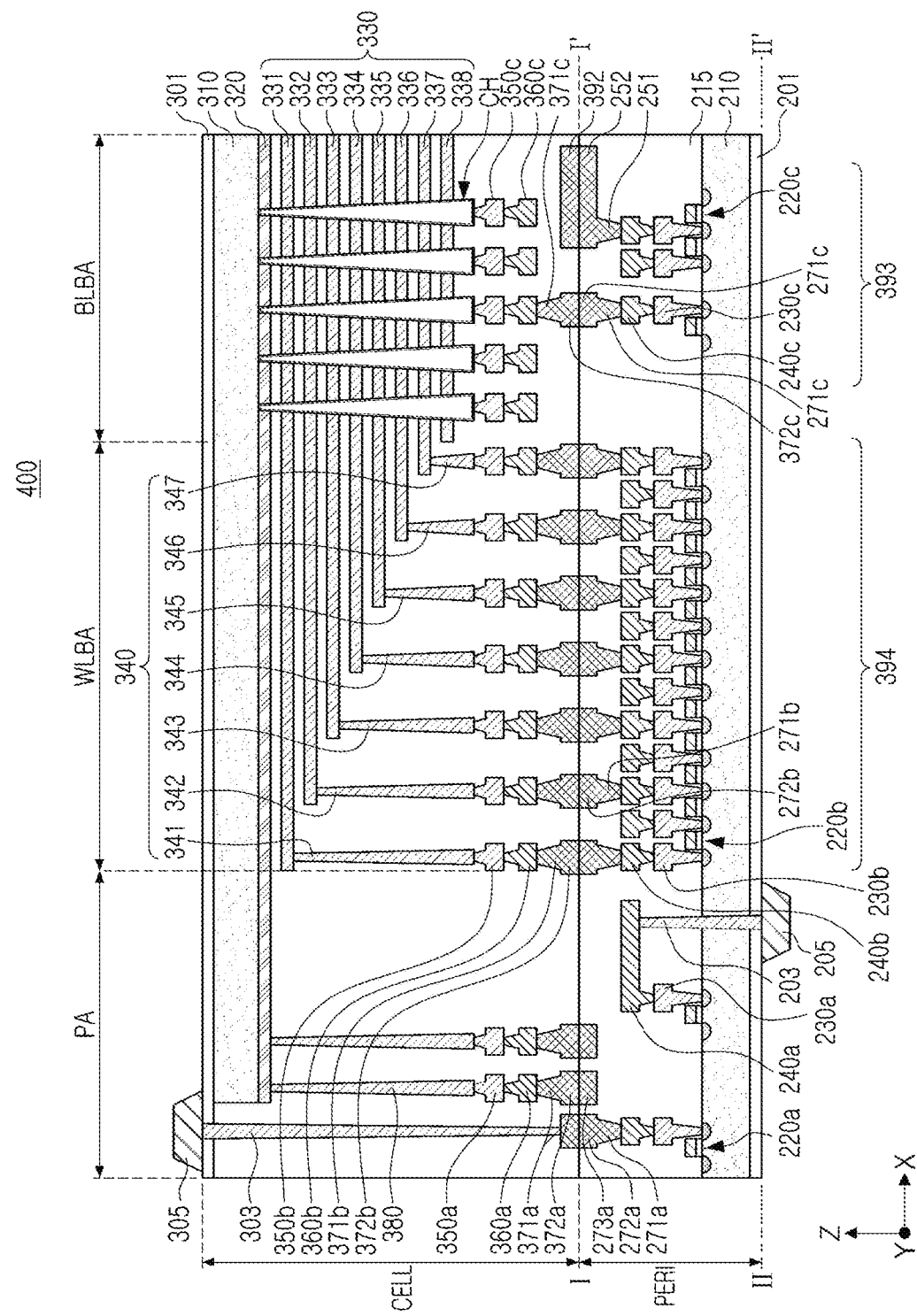
FIG. 15 is a cross-section diagram for a non-volatile memory device according to an exemplary embodiment of the inventive concept.

FIG. 15 is a cross-section diagram for a non-volatile memory device according to an exemplary embodiment of the inventive concept.

Referring to FIG. 15, a memory device 400 may have a chip-to-chip (C2C) structure. The memory device 400 is one exemplary embodiment of the memory device referring to FIG. 1 and FIG. 3. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 210, an interlayer insulating layer 215, a plurality of circuit elements 220*a*, 220*b*, and 220*c* formed on the first substrate 210, first metal layers 230*a*, 230*b*, and 230*c* respectively connected to the plurality of circuit elements 220*a*, 220*b*, and 220*c*, and second metal layers 240*a*, 240*b*, and 240*c* formed on the first metal layers 230*a*, 230*b*, and 230*c*. In an example embodiment, the first metal layers 230*a*, 230*b*, and 230*c* may be formed of tungsten having relatively high resistance, and the second metal layers 240*a*, 240*b*, and 240*c* may be formed of copper having relatively low resistance.

In an example embodiment illustrated in FIG. 15, although the first metal layers 230*a*, 230*b*, and 230*c* and the second metal layers 240*a*, 240*b*, and 240*c* are shown and described, they are not limited thereto, and one or more metal layers may be further formed on the second metal layers 240*a*, 240*b*, and 240*c*. At least a portion of the one or more metal layers formed on the second metal layers 240*a*, 240*b*, and 240*c* may be formed of aluminum or the like having a lower resistance than those of copper forming the second metal layers 240*a*, 240*b*, and 240*c*.

The interlayer insulating layer 215 may be disposed on the first substrate 210 and cover the plurality of circuit elements 220*a*, 220*b*, and 220*c*, the first metal layers 230*a*, 230*b*, and 230*c*, and the second metal layers 240*a*, 240*b*, and 240*c*. The interlayer insulating layer 215 may include an insulating material such as silicon oxide, silicon nitride, or the like.

Lower bonding metals 271*b* and 272*b* may be formed on the second metal layer 240*b* in the word line bonding area WLBA. In the word line bonding area WLBA, the lower bonding metals 271*b* and 272*b* in the peripheral circuit region PERI may be electrically connected to upper bonding metals 371*b* and 372*b* in the cell region CELL in a bonding manner, and the lower bonding metals 271*b* and 272*b* and the upper bonding metals 371*b* and 372*b* may be formed of aluminum, copper, tungsten, or the like.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350*c* and a second metal layer 360*c*. For example, the first metal layer 350*c* may be a bit line contact, and the second metal layer 360*c* may be a bit line. In an example embodiment, the bit line 360c may extend in a first direction (a Y-axis direction), parallel to the upper surface of the second substrate 310.

In an example embodiment illustrated in FIG. 15, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 15, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 15, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 15, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In concluding the detailed description, those skilled in the art will appreciate that many variations and modifications may be made to these exemplary embodiments without substantially departing from the principles of the present inventive concept.

What is claimed is:

1. A storage device comprising:
a nonvolatile memory device comprising a plurality of memory cells, each memory cell is set to one of a plurality of memory cell states, wherein distinct subsets of the memory cell states are associated with one of a plurality of data sets; and
a storage controller configured to access the nonvolatile memory device, wherein the storage controller accesses data stored in one of the memory cells in a first state, performs a multiplier-accumulator (MAC) operation on the data, and sets the one memory cell to a second state corresponding to a result of the MAC operation to perform an in-place update by overwriting the data of the one memory cell with the result without erasing the one memory cell.

2. The storage device of claim 1, wherein each of the data sets comprises a plurality of values respectively mapped to one of the subsets of the memory cell states.

3. The storage device of claim 2, wherein the values are linearly mapped to respective memory cell states of a corresponding one of the subsets of the memory cell states, and each of the values is an integer.

4. The storage device of claim 3, wherein in a current data set to which the first state belongs, when the result of the operation is located to the right of a value mapped to the first state, the second state to which the result of the operation is mapped belongs to the current data set.

5. The storage device of claim 3, wherein in the current data set to which the first state belongs, when the result of the operation is located to the left of a value mapped to the first state, the second state to which the result of the operation is mapped belongs to a next data set adjacent to the current data set.

6. The storage device of claim 1, wherein a threshold voltage of the second state is greater than a threshold voltage of the first state.

7. The storage device of claim 1, wherein the nonvolatile memory device comprises a plurality of flag cells respectively corresponding to the memory cells and storing information about the memory cells.

8. The storage device of claim 7, wherein each of the flag cells comprises activation information indicating which of the data sets has been activated during an in-place update to a corresponding one of the memory cells, and the storage controller accesses the activated data sets based on the activation information.

9. The storage device of claim 7, wherein each of the flag cells comprises program/erase (PE) cycle information of a corresponding memory cell, and the storage controller re-maps states belonging to data sets excluding at least one data set to new threshold voltages based on the PE cycle information.

10. The storage device of claim 7, wherein when erasing one of the memory cells, the storage controller erases a flag cell corresponding to the one memory cell being erased.

11. A method of operating a storage device including a nonvolatile memory device, the method comprising:
receiving an operation command;
performing an operation on a value of a memory cell of the nonvolatile memory device mapped to a first state according to the operation command to generate a result;
determining a second state mapped to the result of the operation; and
overwriting the value of the memory cell with the result without erasing the one memory cell to set the memory cell to the second state,
wherein the nonvolatile memory comprises a plurality of memory cells, each memory cell is set to one of a plurality of memory cell states, wherein distinct subsets of the memory cell states are associated with one of a plurality of data sets, and each of the data sets comprises a plurality of values linearly mapped to one of the subsets, respectively.

12. The method of claim 11, wherein the nonvolatile memory device comprises a plurality of flag cells storing information corresponding to the memory cells, respectively, and each of the flag cells comprises one or more states respectively corresponding to the plurality of data sets.

13. The method of claim 12, before the operation is performed, further comprises:
accessing the plurality of flag cells; and
checking whether each of data sets has been activated.

14. The method of claim 12, wherein activation information of data sets to which the first state and the second state belong as a result of the operation is updated to the flag cell corresponding the data sets.

15. A neural network device comprising:
a memory comprising a plurality of nonvolatile memory cells, each memory cell being set to one of a plurality of memory cell states, wherein distinct subsets of the memory cell states are associated with one of a plurality of data sets, and storing data;
a nonvolatile memory device configured to store a computer program; and
a processor configured to perform an operation on the data by driving a neural network by executing the program, wherein the processor performs the operation on the data stored in one of the nonvolatile memory cells and mapped to a first state to generate a result and sets the one nonvolatile memory cell to a second state mapped to a result of the operation by overwriting the data stored in the one nonvolatile memory cell with the result without erasing the one nonvolatile memory cell.

16. The neural network device of claim 15, wherein each of the data sets comprises a plurality of values respectively mapped to one of the subsets of the memory cell states.

17. The neural network device of claim 15, wherein the operation is addition, subtraction, multiplication, or division for a convolution operation.

18. The neural network device of claim 15, wherein the memory is located within the nonvolatile memory device.

19. The neural network device of claim 15, wherein the memory comprises a plurality of flag cells storing information corresponding to the memory cells, respectively, and each of the flag cells store flag information corresponding to the data sets, respectively.

20. The neural network device of claim 19, wherein the flag cell stores degradation information of the nonvolatile memory cell and the processor re-maps states excluding at least one degraded state to new threshold voltages based on the degradation information.

\* \* \* \* \*